(12) United States Patent
Honma et al.

(10) Patent No.: US 7,674,336 B2
(45) Date of Patent: Mar. 9, 2010

(54) PROCESSING APPARATUS

(75) Inventors: Manabu Honma, Tokyo-To (JP); Yukio Ohizumi, Tokyo-To (JP); Keisuke Nagatsuka, Tokyo-To (JP)

(73) Assignee: Tokyo Electron Limited, Tokyo (JP)

( * ) Notice: Subject to any disclaimer, the term of this patent is extended or adjusted under 35 U.S.C. 154(b) by 565 days.

(21) Appl. No.: 10/576,940

(22) PCT Filed: Oct. 18, 2004

(86) PCT No.: PCT/JP2004/015369

§ 371 (c)(1),
(2), (4) Date: Apr. 24, 2006

(87) PCT Pub. No.: WO2005/041284

PCT Pub. Date: May 6, 2005

(65) Prior Publication Data

US 2007/0075086 A1    Apr. 5, 2007

(30) Foreign Application Priority Data

| Oct. 24, 2003 | (JP) | ............................. 2003-364335 |
| Dec. 16, 2003 | (JP) | ............................. 2003-417833 |
| Feb. 23, 2004 | (JP) | ............................. 2004-046729 |

(51) Int. Cl.
  *C23C 16/46* (2006.01)
  *H01L 21/324* (2006.01)
(52) U.S. Cl. .................. 118/715; 118/733; 156/345.29
(58) Field of Classification Search .................. 118/715, 118/733; 156/345.29
See application file for complete search history.

(56) References Cited

U.S. PATENT DOCUMENTS

| 5,329,095 A | * | 7/1994 | Okase ........................ 219/390 |
| 6,030,457 A | * | 2/2000 | Shimazu et al. .............. 118/715 |
| 6,283,175 B1 | * | 9/2001 | Shimazu ...................... 141/98 |

FOREIGN PATENT DOCUMENTS

JP             57-51639         3/1982

(Continued)

OTHER PUBLICATIONS

Notification of Reasons For Rejection w/ English language translation.

(Continued)

*Primary Examiner*—Jeffrie R Lund
*Assistant Examiner*—Satish Chandra
(74) *Attorney, Agent, or Firm*—Smith, Gambrell & Russell, LLP

(57) ABSTRACT

A thermal processing apparatus according to the present invention comprises a processing container having an opening part at a lower end thereof. The processing container can contain an object to be processed therein. The opening part can be opened and closed by a lid. A flange is provided at a periphery of the opening part. A gas-introducing part for introducing a gas into the processing container is provided in the flange. The object to be processed contained in the processing container is heated by a heating mechanism.

5 Claims, 9 Drawing Sheets

FOREIGN PATENT DOCUMENTS

| JP | 3-114223 | | 5/1991 |
|---|---|---|---|
| JP | 6-11345 | | 2/1994 |
| JP | 07-029841 | * | 1/1995 |
| JP | 7-147240 | | 6/1995 |
| JP | 10-209065 | | 8/1998 |
| JP | 11-097447 | | 4/1999 |
| JP | 2001-7037 | | 1/2001 |
| JP | 2002-9008 | | 1/2002 |
| JP | 2003-257958 | * | 9/2003 |
| JP | 2003257958 | | 9/2003 |

OTHER PUBLICATIONS

Notification of Transmittal of Translation of the International Preliminary Report on Patentability (Form PCT/IB/338)—PCT/JP2004/015369, dated Jan. 2004.

PCT International Preliminary Report on Patentability (Form PCT/IPEA/409)—PCT/JP2004/015369, dated Jan. 2004.

Translation of CD-ROM of Japanese Utility Model Application No. 50673/1992 (JP U.M. Laid-Open Publication No. 11345/1994).

Japanese Office Action issued on Jun. 24, 2008.

* cited by examiner

PROCESSING APPARATUS

TECHNICAL FIELD

The present invention relates to a longitudinal type of thermal processing apparatus that conducts a thermal process to a plurality of objects to be processed at one time.

BACKGROUND ART

In the manufacturing of a semiconductor device, various kinds of apparatuses are used to conduct a process such as an oxidation, a diffusion, CVD (Chemical Vapor Deposition) and so on, to an object to be processed, for example, a semiconductor wafer. As one of them, a longitudinal type of thermal processing apparatus that is capable of conducting a thermal process to a plurality of objects to be processed at one time is known.

This longitudinal type of thermal processing apparatus is generally provided with a processing container made of quartz having an opening part at a lower end thereof. A holder for holding a plurality of objects to be processed is contained in the processing container. The opening part is dosed hermetically by a lid, and the plurality of objects to be processed are heated by a heating unit provided around the processing container, and thus a predetermined thermal process is conducted under a predetermined process-gas atmosphere (for example, refer to Japanese Patent Laid-Open Publication No. 2003-257958).

FIG. 10 represents a magnified cross-sectional view of a main part of a conventional longitudinal type of thermal processing apparatus. A processing container 102 shown in FIG. 10 has an opening part (a furnace opening) 103 at a lower end thereof and a flange portion 104 at a periphery of the lower end. The flange portion 104 is supported by a flange holder 105 made of a metal. An opening end 102a (a lower end) of the processing container 102 is made to come in contact with a lid 108 so as to be closed. The lid 108 is made of a metal, for example, a stainless steel. An O-ring 160 made of a heat-resistance resin is fitted on a fitting groove 161 of the lid 108 as an airtight material in order to seal between the lid 108 and the opening end 102a of the processing container 102.

SUMMARY OF THE INVENTION

However, an inner surface (an upper surface) of the lid 108 made of a metal is exposed inside the processing container 102. Accordingly, the inner surface of the lid 108 is corroded by a corrosive process gas, and metal pollution of the objects to be processed can be caused.

Additionally, the O-ring 160 is put in between the opening part 102a of the processing container 102 and the lid 108, but an out gas (an outside gas) can be sucked into the processing container 102 from a vicinity of the O-ring 160 when the processing container 102 is vacuumed. In this case, the objects to be processed can be polluted by the gas flow.

Furthermore, since the O-ring 160 is in contact with the high-temperature opening end 102a of the processing container 102, durability is easily deteriorated. In order to restrain the deterioration of durability of the O-ring 160, a cooling-medium channel 163 can be provided in the lid 108 in a vicinity of the O-ring 160. However, when the lid 108 is cooled too much, reaction by-product of the process gas easily adheres to the inner surface of the lid 108. Accordingly, temperature management of the cooling medium (for example, ON/OFF control of water cooling) is greatly difficult. Incidentally, a heater 164 for heating the lid 108 can be fitted on an outer surface (a lower surface) of the lid 108 in order to prevent adhesion of the reaction by-product.

The present invention has been made based on the above consideration, and an object of the present invention is to provide a longitudinal type of thermal processing apparatus that can solve the problem of the corrosion of the lid. In addition, an object of the present invention is to provide a longitudinal type of thermal processing apparatus that can solve the problem of the inflow of the out gas from a vicinity of the O-ring. Furthermore, an object of the present invention is to provide a longitudinal type of thermal processing apparatus that can improve the durability of the O-ring.

The present invention is a longitudinal type of thermal processing apparatus, comprising: a processing container made of quartz, having an opening part at a lower end thereof; a lid provided under the opening part, capable of moving up and down so as to open and close the opening part; a holder provided on the lid, capable of hold a plurality of objects to be processed in a tier-like manner; and a heating unit provided around the processing container; wherein the lid has an inner lid part made of quartz that comes in contact with a lower-end surface of the opening part, and an outer lid part made of a metal that covers an outside surface of the inner lid part; an outer-periphery upper portion of the inner lid part is located inside an outer-periphery edge of the lower-end surface of the opening part; and an O-ring is provided on an inner-periphery upper portion of the outer lid part so as to come in contact with a surface of the outer-periphery upper portion of the inner lid part and the lower-end surface of the opening part in order to seal therebetween.

According to the present invention, since a space between the surface of the outer-periphery upper portion of the inner lid part made of quartz and the lower-end surface of the opening part of the processing container is sealed by the O-ring, a problem of corrosion of the lid (particularly, the outer lid part) can be solved, and a problem of an out-gas inflow from a vicinity of the O-ring can be also solved.

Preferably, a cooling-medium channel for cooling the O-ring is provided in a vicinity of the O-ring in the outer lid part.

In this case, the O-ring can be effectively cooled and thus durability of the O-ring can be improved.

Additionally, it is preferable that a space is formed between the inner lid part and the outer lid part, and that a planer heater for heating the inner lid part is provided in the space out of contact with the inner lid part.

In this case, a problem of dust generation by sliding friction between the inner lid part and the heater can be avoided.

Additionally, the present invention is a longitudinal type of thermal processing apparatus, comprising: a processing container made of quartz, having an opening part at a lower end thereof; a lid provided under the opening part, capable of moving up and down so as to open and close the opening part; a holder provided on the lid, capable of hold a plurality of objects to be processed in a tier-like manner; and a heating unit provided around the processing container; wherein the lid has an inner lid part made of quartz that comes in contact with a lower-end surface of the opening part, and an outer lid part made of a metal that covers an outside surface of the inner lid part; and the lower-end surface of the opening part and an upper-end surface of the inner lid part, which come in contact with each other, are mirror-finished.

According to the present invention, since the mirror-finished lower-end surface of the opening part and the mirror-finished upper-end surface of the inner lid part come in contact with each other, both the surfaces are sealed without using an O-ring, and therefore, a problem of corrosion of the lid (particularly, the outer lid part) can be solved.

It is preferable that: a first flange is provided at an outside periphery of the opening part; the first flange is located higher than the lower-end surface of the opening part; a second flange is provided at an outside periphery of the inner lid part; the second flange is located lower than the upper-end surface of the inner lid part; a flange holder made of a metal is provided on the first flange via a sheet made of a resin; a first O-ring that seals between the first flange and the flange holder and a second O-ring that seals between the second flange and the flange holder are provided on the flange holder; and the first O-ring, an inner surface of the flange holder from the first O-ring to the second O-ring, the second O-ring, an upper surface of the second flange inside the second O-ring, an outer surface of the inner lid part from the second O-ring to the upper-end surface, an outer surface of the opening part from the lower-end surface to the first flange, and a lower surface of the first flange inside the first O-ring form a channel for vacuuming.

In this case, sealing performance between the processing container and the lid can be improved, and the out gas from a vicinity of the first O-ring and the second O-ring can be vacuumed.

Additionally, it is preferable that: a central opening part is formed at a central portion of the outer lid part; a third flange of a rotation-introducing mechanism, which causes the holder to rotate, is fixed on a lower surface of the central opening part so as to close the central opening part; a rotation shaft of the rotation-introducing mechanism extends upward from a central portion of the third flange; a boss part that surrounds the rotation shaft is formed at a central portion of the inner lid part; double third and fourth O-rings are provided between a lower-end surface of the boss part and an upper surface of the third flange, which come in contact with each other; and a gas-discharging hole for vacuuming a space defined by the lower-end surface of the boss part, the upper surface of the third flange and the third and fourth O-rings is formed in the first flange.

In this case, sealing performance between the boss part of the inner lid part and the third flange of the rotation-introducing mechanism can be improved.

In this case, it is preferable that the gas-discharging hole is connected to the channel for vacuuming. Accordingly, a space between the double O-rings can be easily vacuumed, and thus the out gas that flows in from the outer O-ring can be easily discharged.

In addition, it is preferable that a plurality of patches made of a resin is screwed on the flange holder so as to come in contact with an outer-periphery surface of the first flange to form a predetermined gap between the flange holder and the first flange.

In this case, it is prevented that the first flange is damaged by a contact between the first flange made of quartz and the flange holder made of a metal.

Additionally, the present invention is a longitudinal type of thermal processing apparatus comprising: a processing container made of quartz, having an opening part at a lower end thereof; a lid provided under the opening part, capable of moving up and down so as to open and close the opening part; a holder provided on the lid, capable of hold a plurality of objects to be processed in a tier-like manner; and a heating unit provided around the processing container; wherein the lid has an inner lid part made of quartz that comes in contact with a lower-end surface of the opening part, and an outer lid part made of a metal that covers an outside surface of the inner lid part; an outer-periphery upper portion of the inner lid part is located inside an outer-periphery edge of the lower-end surface of the opening part; a fourth flange is provided on an outer lower portion of the inner lid part; a second flange holder is provided on the outer lid part to be located between the lower-end surface of the opening part and an upper surface of the fourth flange to hold the fourth flange; a fifth O-ring that seals between the lower-end surface of the opening part and the second flange holder and a sixth O-ring that seals between the upper surface of the fourth flange and the second flange holder are provided on the second flange holder; and a cooling-medium channel is provided in the second flange holder in order to cool the fifth O-ring and the sixth O-ring.

According to the present invention, since a space between the upper surface of the fourth flange of the inner lid part and the lower-end surface of the opening part of the processing container is sealed by the second flange holder, the fifth O-ring and the sixth O-ring, a problem of corrosion of the lid (particularly, the outer lid part) can be solved, and a problem of an out-gas inflow from a vicinity of the O-ring can be also solved. Furthermore, since the O-ring(s) can be effectively cooled, durability of the O-ring(s) can be improved.

Preferably, a liquid-receiving part capable of receiving an aqueous solution is provided on the upper surface of the inner lid part; and a liquid-guiding part is provided at a lower portion of the inner surface of the processing container so as to guide an aqueous solution, which is generated on the inner surface of the processing container and flows thereon, into the liquid-receiving part.

In this case, it is prevented that the aqueous solution flows into a contact surface of the inner lid part and the processing container. Accordingly, roughening of the contact surface, corrosion of the flange holder(s) made of a metal and the outer lid part made of a metal, and so on, can be prevented. The effect is useful in a dry cleaning process particularly wherein a hydrogen fluoride is used.

The liquid-receiving part can be, for example, composed of a liquid-receiving pan made of quartz.

BEST MODE FOR CARRYING OUT THE PRESENT INVENTION

Figure 1:
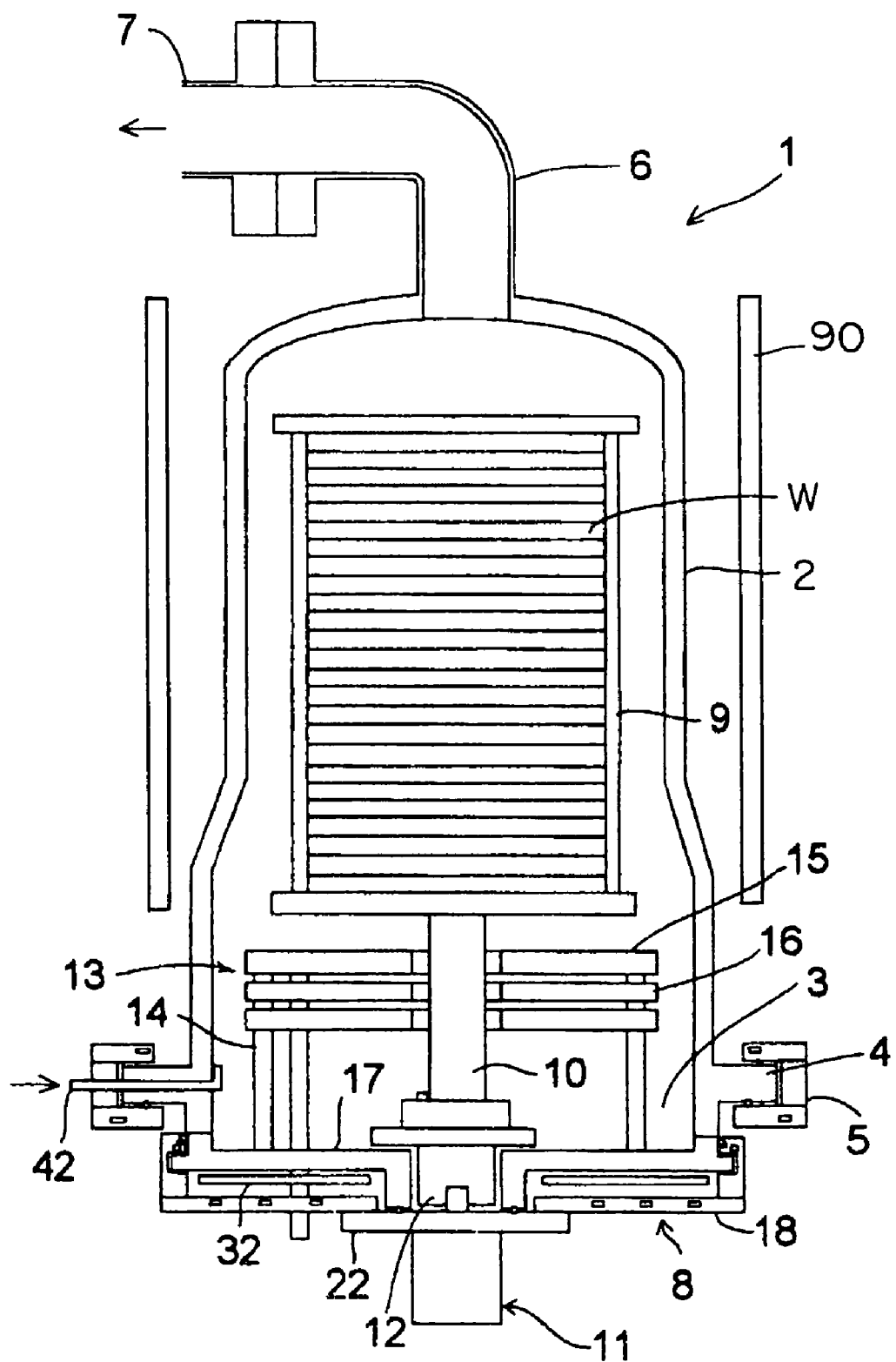
FIG. 1 is a schematic vertical cross-sectional view of a longitudinal type of thermal processing apparatus according to the first embodiment of the present invention.
Figure 2:
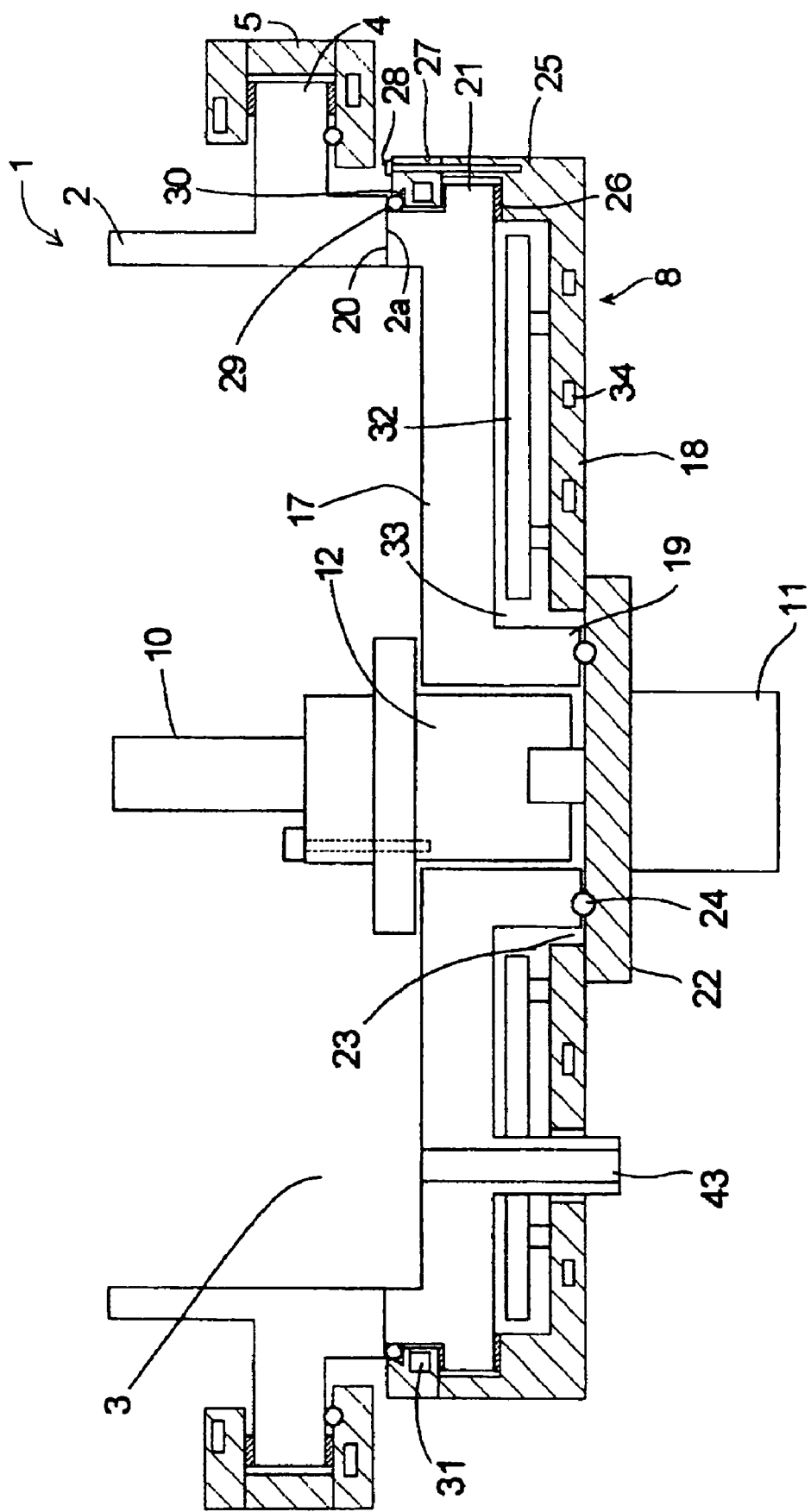
FIG. 2 is a magnified cross-sectional view of a main part of the longitudinal type of thermal processing apparatus in FIG. 1.

Hereinafter, embodiments of the present invention are described in details based on the attached drawings. FIG. 1 is a vertical cross-sectional view of a longitudinal type of thermal processing apparatus according to the first embodiment of the present invention. FIG. 2 is a magnified cross-sectional view of a main part of the longitudinal type of thermal processing apparatus in FIG. 1.

As shown in FIG. 1, the longitudinal type of thermal processing apparatus 1 is provided with a longitudinal processing container 2 that contains a plurality of objects to be processed, for example, semiconductor wafers W and that conducts a predetermined thermal process. This processing container 2 is formed of quartz (quartz glass) having a heat resistance and a corrosion resistance. An upper end of the processing container 2 is formed in a dome-like manner, to be concrete, in an upside-down funnel-like manner, and a lower end thereof is opened as a furnace opening 3. A flange portion 4 (a first flange) is provided at an outer periphery of an opening part of the processing container 2. The flange portion 4 is fixed on a not-shown base plate via a flange holder 5. An L-shaped gas-discharging pipe portion 6 is provided at a central portion of a ceiling portion of the processing container 2. A pipe 7 of a gas-discharging system, which is capable of reducing a pressure inside the processing container 2 to a predetermined pressure, for example, about 110 kgf, is connected to the gas-discharging pipe portion 6. A cylindrical heater 90 capable of controlling the inside of the processing container 2 at a predetermined temperature, for example 300° C. to 1200° C., is provided around the processing container 2.

A lid 8 that opens and closes the furnace opening (the lower-end opening) 3 of the processing container 2 is provided under the processing container 2 so as to be capable of moving up and down by means of a not-shown elevating mechanism. A boat (a holder) 9 made of quartz that holds a plurality of, for example about 25, wafers W in a tier-like manner at predetermined intervals in a vertical direction, is provided on an upper part of the lid 8. The boat 9 has a prop 10 at a lower central portion thereof, and the prop 10 is connected to a rotation shaft 12 of a rotation-introducing mechanism 11 provided at a central portion of the lid 8.

A thermo-plug 13 as an insulating unit that restrains radiation of heat from the furnace opening 3 is provided at a central portion of the lid 8 without interfering with the prop 10. The thermo-plug 13 of this embodiment is mainly composed of: a plurality of studs 14 set up on the lid 8, a lower portion heater 15 formed by a planer heating element and provided at upper-end portions of the studs 14 in a substantially horizontal manner, and a plurality of heat shield panels 16 arranged at predetermined intervals in a height direction of the studs 14.

As shown in FIG. 2, the lid 8 is composed of an inner lid part 17 made of quartz that is made to come in contact with an opening end (a lower-end of the opening part) 2a of the processing container 2, and an outer lid part 18 made of a metal that covers an outer surface of the inner lid part 17.

An outer-periphery upper portion of the inner lid part 17 is located inner than an outer-periphery edge of the opening end 2a of the processing container 2. A boss part 19, into which the rotation shaft 12 is inserted, extends downward at a central portion of the inner lid part 17. At a peripheral portion of the inner lid part 17, an annular contact surface 20 that comes in contact with the opening end 2a of the processing container 2 is formed so as to protrude upward. Additionally, a flange portion 21 (second flange) is formed at an outer-periphery lower portion of the inner lid part 17.

A rotation-introducing mechanism 11 for rotating the boat 9 is provided at a central portion of the outer lid part 18. This rotation-introducing mechanism 11 has a flange portion 22 (a third flange) that is fixed on a lower surface of the outer lid part 18, and the rotation shaft 12 that protrudes upward from a central portion of the flange portion 22. The flange portion 22 of the rotation-introducing mechanism 11 is connected on the lower surface of the outer lid part 18 so as to close an opening part 23 that has been formed at a central portion of the outer lid part 18.

An O-ring 24 is provided between a lower-end portion of the boss part 19 of the inner lid part 17 and the flange portion 22 of the rotation-introducing mechanism 11 so as to seal therebetween.

An annular rising portion 25 is formed at a peripheral-edge portion of the outer lid part 18. The flange portion 21 of the inner lid part 17 is placed on an inner upper surface of the rising portion 25 via a sheet 26 made of a heat-resistance resin. Additionally, an annular flange holder 27 for fixing the flange portion 21 of the inner lid part 17 is detachably mounted on the rising portion 25 by screws 28. The flange holder 27 is composing a part of the outer lid part 18. An O-ring 29 made of a heat-resistance resin, for example Teflon (registered trademark), is provided on an inner periphery surface of an upper-end portion of the flange holder 27, so as to come in contact with an outer-periphery surface of an upper-end portion of the inner lid part 17 and a lower surface of the opening end 2a of the processing container 2 in order to seal therebetween. An annular holding groove 30 that holds the O-ring 29 is formed on the inner periphery surface of the upper-end portion (an inner-periphery upper-end portion) of the flange holder 27. A cooling-medium channel 31 (for example, a cooling-water channel) for cooling the O-ring 29 is provided in the flange holder 27 in a vicinity of (for example, exactly under) the O-ring 29.

As shown in FIGS. 1 and 2, a planer heater 32 that heats the inner lid part 17 is provided between the inner lid part 17 and the outer lid part 18, out of contact with the inner lid part 17. To be concrete, an annular hollow room 33 is formed between the inner lid part 17 and the outer lid part 18, and the heater 32 is supported on an upper surface of the outer lid part 18 in the hollow room 33. Cooling-medium channels 34 are provided in the outer lid part 18 at portions corresponding to the heater 32. The heater 32 is formed in such a manner that a resistance heating wire is sandwiched in between two mica boards from above and bottom, and it is further sandwiched in between two stainless steel boards from above and bottom by thermo-compression. As the heater 32 is out of contact with the inner lid part 17, the inner lid part 17 is heated from its back surface not by thermal-conduction heating but by radiation heating. A black or dark coloring surface treatment, for example coating of a titanic oxide ($TiO_2$), is conducted to a radiation plane of the heater 32 in order to increase efficiency of the radiation heating.

Figure 4:
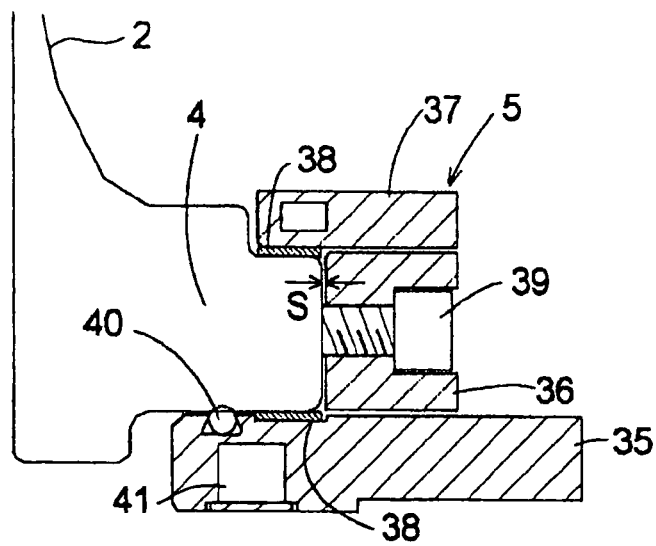
FIG. 4 is a magnified vertical cross-sectional view of a flange holder portion in FIG. 3.

On the other hand, as shown in FIG. 4, a flange holder 5 of the processing container 2 is composed of a lower ring 35 that comes in contact with a lower surface of the flange portion 4 of the processing container 2 and supports the processing container 2, a middle ring 36 that is placed on the lower ring 35 and surrounds an outer periphery of the flange portion 4, an upper ring 37 that is arranged on the middle ring 36 and presses an upper surface of the flange portion 4, and not-shown screws that fix the upper ring 37 on the lower ring 35 via the middle ring 36.

Figure 5:
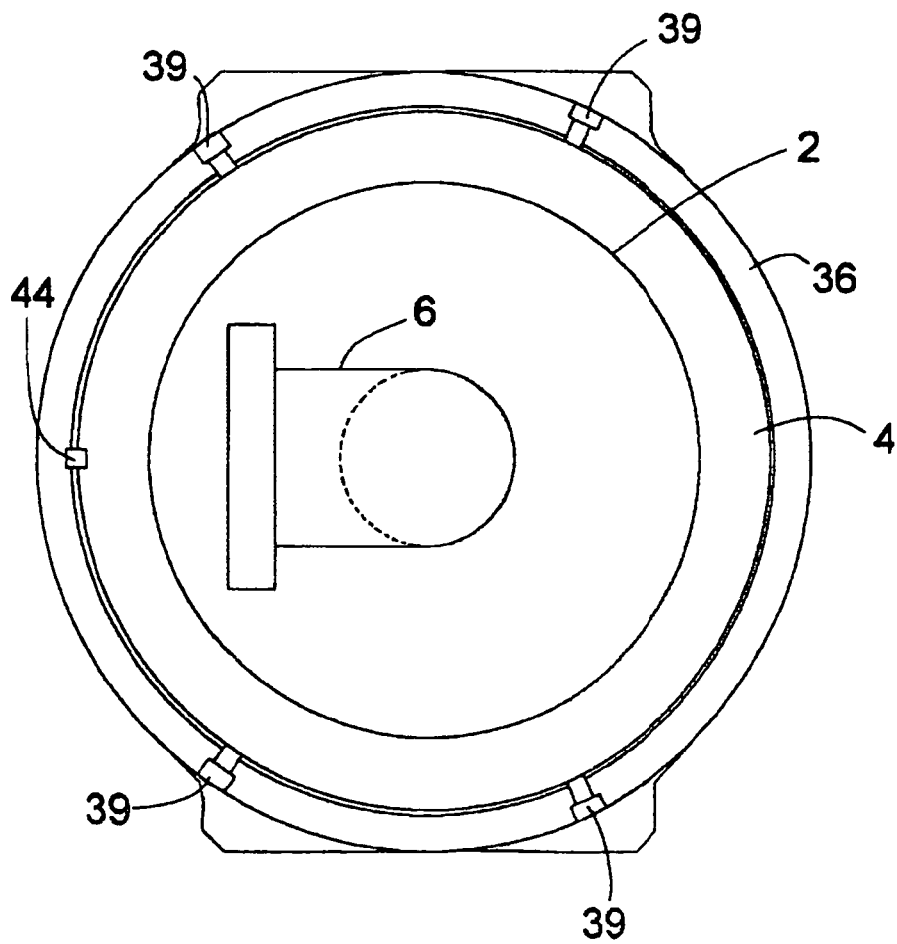
FIG. 5 is a schematic horizontal cross-sectional view of the flange holder portion in FIG. 3.

The upper ring 37 is divided into a plurality of sections. Sheets 38 made of a heat-resistance resin are located between the lower ring 35 and the flange portion 4, and between the upper ring 37 and the flange portion 4, respectively. As shown in FIGS. 4 and 5, a plurality of patches 39 made of a resin, preferably made of a heat-resistance resin, are threadedly engaged through the middle ring 36 in a radial direction so as to come in contact with the outer-periphery surface of the flange portion 4 in order to form a predetermined gap, for example a gap S whose thickness is 1 mm, between the flange portion 4 and the middle ring 36.

An O-ring 40 that seals between the lower ring 35 and the flange portion 4 is provided on the lower ring 35. A cooling-medium channel (for example, a cooling-water channel) 41 for cooling the O-ring 40 is provided in the lower ring 35 in a vicinity of the O-ring 40.

Incidentally, in FIG. 1, 42 represents a process-gas introducing port which is provided in the flange portion 4 of the processing container 2. In FIG. 2, 43 represents a port thround which a power-supply cable and the like for the lower portion heater 15 are inserted. In FIG. 5, 44 represents a positioning pin.

According to the longitudinal type of thermal processing apparatus 1 composed as described above, it comprises the processing container 2 made of quartz, having the opening part at a lower end thereof; the lid 8 provided under the opening part, capable of moving up and down so as to open and close the opening part; the boat 9 provided on the lid 8, capable of holding the plurality of wafers W in a tier-like manner; and the heater 90 provided around the processing container 2, wherein the lid 8 consists of the inner lid part 17 made of quart that comes in contact with the lower-end surface 2a of the opening part, and the outer lid part 18 made of a metal that covers the outside surface of the inner lid part 17; the outer-periphery upper portion of the inner lid part 17 is located inside the outer-periphery edge of the lower-end surface 2a of the opening part; and the O-ring 29 is provided on the inner-periphery upper portion of the outer lid part 18 so as to come in contact with the surface of the outer-periphery upper portion of the inner lid part 17 and the lower-end surface 2a of the opening part in order to seal therebetween. Thus, since the O-ring 29 seals between the surface of the outer-periphery upper portion of the inner lid part 17 and the lower-end surface 2a of the opening part of the processing container 2, a problem of corrosion of the lid 8 (particularly, the outer lid part 18) can be solved, and also a problem of an inflow of an out gas from a vicinity of the O-ring 29 can be solved.

Additionally, since the cooling-medium channel 31 is provided in a vicinity of the O-ring 29 in the outer lid part 18 in order to cool the O-ring 29, the O-ring 29 can be effectively cooled and durability of the O-ring 29 can be improved. Particularly, when the cooling-medium channel 31 is provided at a position apart from the inside of the processing container 2, temperature management of the cooling medium (for example, ON/OFF control of cooling water) is not required, and thus a cooling system can be simplified.

Furthermore, since the space is formed between the inner lid part 17 and the outer lid part 18 and in the space the planer heater 32 for heating the inner lid part 17 is provided out of contact with the inner lid part 17, a problem of dust generation by sliding friction between the inner lid part 17 and the heater 32 can be avoided.

Still more, since the plurality of patches 39 made of a resin are screwed on the flange holder 5 in a manner penetrating in radial directions so as to come in contact with the outer-periphery surface of the flange portion 4 in order to form a predetermined gap S between the flange holder 5 and the flange portion 4, it is prevented that the flange portion 4 is damaged due to a partial contact between the flange portion 4 made of quartz and the flange holder 5 made of a metal, which may be caused when an external force and the like are inflicted on the processing container 2 in vacuuming by the gas-discharging pipe portion 6.

Figure 3:
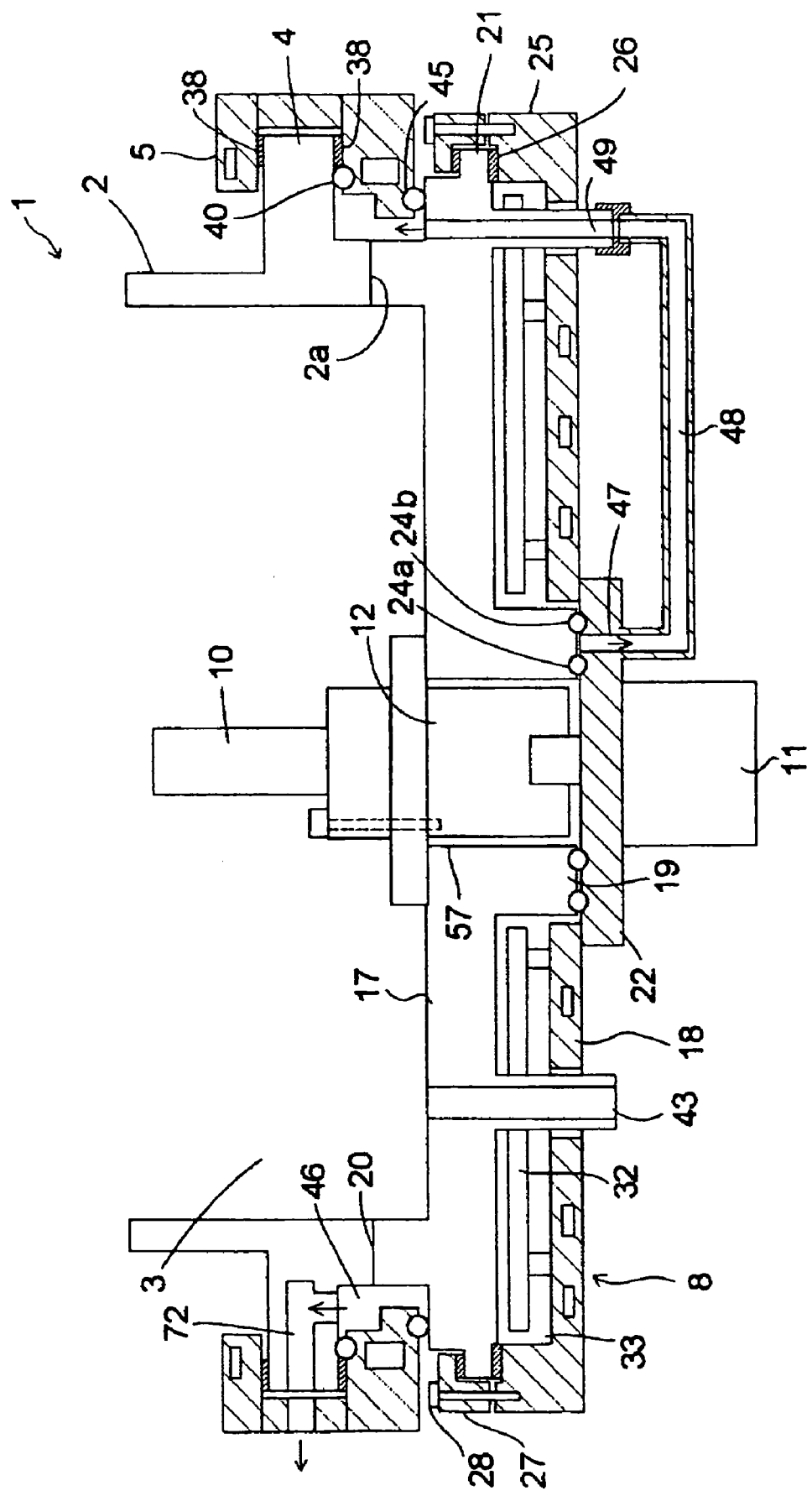
FIG. 3 is a magnified cross-sectional view of a main part of a longitudinal type of thermal processing apparatus according to the second embodiment of the present invention.

FIG. 3 is a magnified cross-sectional view of a main part of a longitudinal type of thermal processing apparatus of the second embodiment of the present invention. In FIG. 3, the same numeral signs are marked on the same parts as those of the embodiment in FIGS. 1 and 2.

In a longitudinal type of thermal processing apparatus 1 of the present embodiment, an opening end 2a of a processing container 2 and a contact surface 20 of an inner lid part 17 are mirror-finished (for example, smoothness: 0.1 μm, plane roughness: Ra 0.01 μm) in order that the opening end 2a of the processing container 2 and the inner lid part 17 are made to closely contact with each other when a lid 8 is closed. As shown in FIG. 3, a flange holder 5 made of a metal is provided on a flange portion 4 via a sheet 38 made of a resin. A first O-ring 40 that seals between the flange holder 5 and the flange portion 4 and a second O-ring 45 that seals between the flange holder 5 and the inner lid part 17 are provided on the flange holder 5. Furthermore, as shown in FIG. 3, a circular channel 46 for vacuuming is formed so as to vacuum a space at an outer periphery of the flange portion 4 and the inner lid part 17. To be concrete, the channel 46 for vacuuming is formed by the first O-ring 40, an inner surface of the flange holder 5 from the first O-ring 40 to the second O-ring 45, the second O-ring 45, an upper surface of a flange portion 21 inside the second O-ring 45, an outer periphery surface of the inner lid part 17 from the flange portion 21 to the contact surface 20, an outer periphery surface of an opening part from the contact surface 20 to the flange portion 4, and a lower surface of the flange portion 4 inside the first O-ring 40. A gas-discharging hole 72 that communicates with the channel for vacuuming 46 and extends outward in a radial direction is provided in the flange portion 4. A not-shown vacuum pump is connected to the gas-discharging hole 72. As a vacuum pump, a combination of a dry pump and a turbo-molecular pump is preferable in order to obtain a high-level vacuum.

A boss part 19, through which a rotation shaft 12 is inserted, extends downward in a central portion of the inner lid part 17. Double O-rings 24a and 24b (a third O-ring and a fourth O-ring) are provided in a concentric circle manner between a flange portion 22 of a rotation-introducing mechanism 11 and a lower-end contact surface of the boss part 19 of the inner lid part 17. A gas-discharging hole 47 for vacuuming a space defined by the double O-rings 24a and 24b is provided in the flange portion 22 of the rotation-introducing mechanism 11. As shown in FIG. 3, the gas-discharging hole 47 is connected to the channel for vacuuming 46 via a pipe 48 and a channel 49. The channel 49 is provided in the inner lid part 17.

According to the longitudinal type of thermal processing apparatus 1 composed as described above, it comprises the processing container 2 made of quartz, having the opening part at a lower end thereof; the lid 8 provided under the opening part, capable of moving up and down so as to open and close the opening part; the boat 9 provided on the lid 8, capable of holding the plurality wafers W in a tier-like manner; and the heater 90 provided around the processing container 2, wherein the lid 8 consists of the inner lid part 17 made of quartz that comes in contact with the lower-end surface 2a of the opening part, and the outer lid part 18 made of a metal that covers an outside surface of the inner lid part 17; and the lower-end surface 2a of the opening part and the upper-end surface 20 of the inner lid part 17 that come in contact with each other are mirror-finished. Thus, since the mirror-finished lower-end surface 2a of the opening part and the mirror-finished upper-end surface 20 of the inner lid part 17 come in contact with each other, a problem of corrosion of the lid 8 (particularly, the outer lid part 18) can be solved. Furthermore, basically, both the surfaces are sealed without using an O-ring, so that a problem of durability of an O-ring, a problem of an out gas in a vicinity of an O-ring, and a problem of cooling an O-ring can be solved.

Additionally, the flange portion 4 is provided at the outside periphery of the opening part; the flange portion 4 is located higher than the lower-end surface 2a of the opening part; the flange portion 21 is provided at the outside periphery of the inner lid part 17; the flange portion 21 is located lower than the upper-end surface of the inner lid part 17; the flange holder 5 made of a metal is provided on the flange portion 4 via the sheet 38 made of a resin; the first O-ring 40 that seals between the flange portion 4 and the flange holder 5 and the second O-ring 45 that seals between the flange portion 21 and the flange holder 5 are provided on the flange holder 5; and the first O-ring 40, the inner surface of the flange holder 5 from the first O-ring 40 to the second O-ring 45, the second O-ring 45, the upper surface of the flange portion 21 inside the second O-ring 45, the outer surface of the inner lid part 17 from the flange portion 21 to the upper-end surface 20, the outer surface of the opening part from the lower-end surface 2a to the flange portion 4, and the lower surface of the flange portion 4 inside the first O-ring 40 form the channel for vacuuming 46. Thus, sealing performance between the processing container 2 and the lid 8 can be improved, and additionally, an out gas in a vicinity of the first O-ring 40 and the second O-ring 45 can be vacuumed.

In addition, a central opening part is formed at a central portion of the outer lid part 18; the flange portion 22 of the rotation-introducing mechanism 11, which causes the boat 9 to rotate, is fixed on the lower surface of the central opening part so as to close the central opening part; the rotation shaft 12 of the rotation-introducing mechanism 11 extends upward from a central portion of the flange portion 22; the boss part 19 that surrounds the rotation shaft 12 is formed at a central portion of the inner lid part 17; the double third O-rings 24a and fourth O-rings 24b are provided between a lower-end surface of the boss part 19 and an upper surface of the flange portion 22, which come in contact with each other; and the gas-discharging hole 47 for vacuuming a space defined by a lower-end surface of the boss part 19, an upper surface of the flange portion 22 and the third O-ring 24a and the fourth O-ring 24b is formed in the flange portion 22. Thus, sealing performance between the boss part 19 of the inner lid part 17 and the flange portion 22 of the rotation-introducing mechanism 11 can be improved.

Further more, since the gas-discharging hole 47 is connected to the channel for vacuuming 46, it is possible to easily vacuum the space between the double O-rings 24a and 24b, and also it is possible to easily discharge an out gas generated from the double O-rings 24a and 24b.

Figure 6:
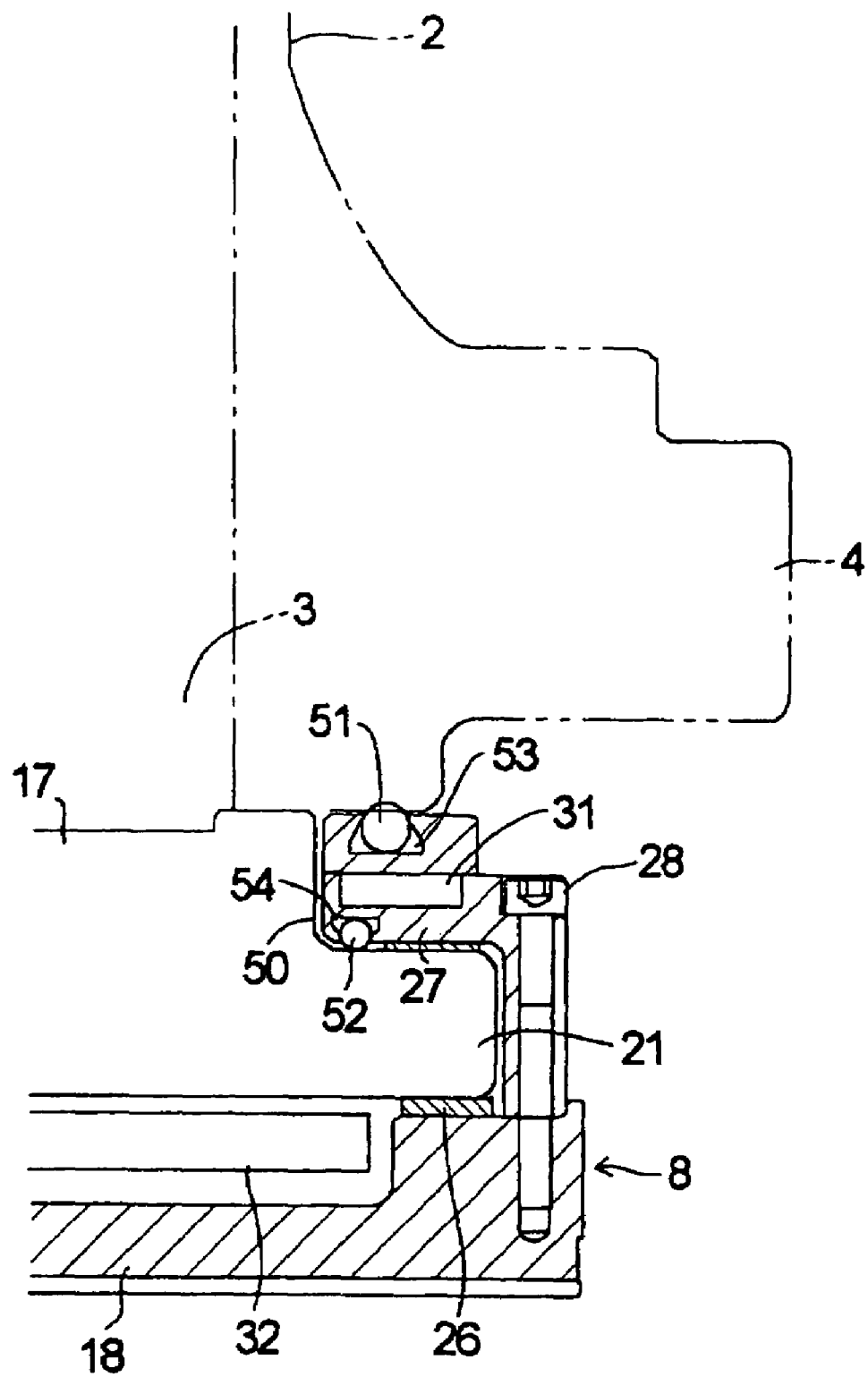
FIG. 6 is a magnified cross-sectional view of a main part of a longitudinal type of thermal processing apparatus according to the third embodiment of the present invention.

FIG. 6 is a magnified cross-sectional view of a main part of a longitudinal type of thermal processing apparatus of the third embodiment of the present invention. In the present embodiment, the same numerical signs are marked on the same parts as those in the embodiments described above, and therefore, explanation thereof is omitted.

A lid 8 that closes a lower opening end of a processing container 2 made of quartz consists of an inner lid part 17 made of quartz that is adapted to come in contact with the opening end of the processing container 2 and an outer lid part 18 made of a metal that covers an outer surface of the inner lid part 17.

An annular recess portion 50 caved inner than an opening-end outer periphery of the processing container 2 is formed on an outer-periphery upper portion (an upper half of an outer periphery portion) of the inner lid part 17. A flange portion 21 is formed by an outer-periphery lower portion (a lower half of the outer periphery portion) of the inner lid part 17.

A flange holder 27 (a second flange) is provided on the outer lid part 18, is located in the annular recess portion 50, and holds the flange portion 21 of the inner lid part 17. A fifth O-ring 51 that contacts with a lower surface of the opening end of the processing container 2 is provided on an upper part of the flange holder 27. Additionally, a sixth O-ring 52 that contacts with the upper surface of the flange portion 21 is provided at a lower part of the flange holder 27. A cooling-medium channel 31 (for example, a cooling-water channel) for cooling the fifth O-ring 51 and the sixth O-ring 52 is provided inside the flange holder 27.

The flange holder 27, whose cross-section has a substantially upside-down L-shape (having a vertical portion and a horizontal portion), is formed in an annual manner (in a ring-like manner) so as to cover (surround) the flange portion 21. This flange holder 27 is detachably fixed on the outer lid part 18 by screws 28 under a condition wherein the flange holder 27 holds the flange portion 21 of the inner lid part 17. A first holding groove 53 for holding the fifth O-ring 51 is formed in an annual manner on an upper part of the horizontal portion of the flange holder 27. Additionally, a second holding groove 54 for holding the sixth O-ring 52 is formed in an annual manner at a lower part of the horizontal portion of the flange holder 27. The cooling-medium channel 31 is located between the first holding groove 53 and the second holding groove 54, and is capable of effectively cooling the fifth O-ring 51 and the sixth O-ring 52.

According to the longitudinal type of thermal processing apparatus of the present embodiment, a problem of corrosion of the lid 8 (particularly, the outer lid part 18) can be solved, and furthermore a problem of an out gas from the O-rings 51 and 52 can be solved, and besides, durability of the O-rings 51 and 52 is so improved that it becomes possible to use them up to a furnace temperature of 1000° C. without burnout.

According to the longitudinal type of thermal processing apparatus as shown in FIG. 6, there is no problem about the durability of the O-rings in a thermal process under a reduced pressure. However, when the reduced pressure in the processing container is restored to a normal condition, there is a case wherein a temperature of an upper surface of an O-ring rises higher by some dozens of degrees than the heat-resistance temperature (300° C.) of the O-ring, due to an increase of heat-conducting materials. Thus, it is preferable that the flange portion 4 of the processing container 2 is made to be opaque so as not to be capable of conducting heat and/or light from the heater in order to prevent burnout and/or deterioration of the O-ring caused by the above temperature rising.

Figure 7:
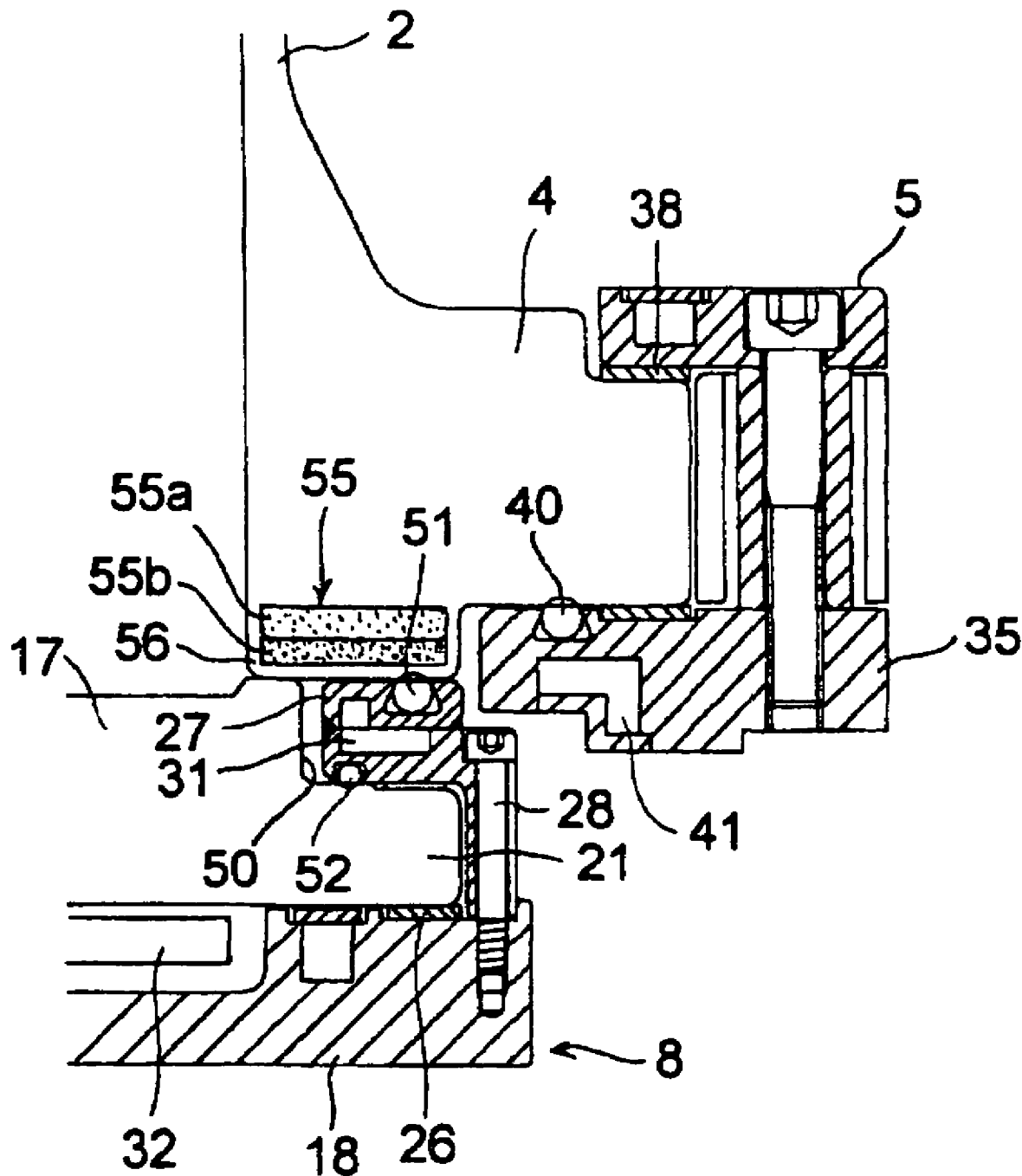
FIG. 7 is a magnified cross-sectional view of a main part of a modification example of the longitudinal type of thermal processing apparatus in FIG. 6.

In FIG. 7, an example is shown wherein an opaque layer (an opaque quartz layer) 55 is provided from a substantial central portion to an inner portion in a width-direction (a radial-direction) of a lower surface of the flange portion 4, in order to prevent burnout or deterioration of the fifth O-ring 51.

It is more preferable that the opaque layer 55 is provided in such a manner that a first opaque layer 55a with a low-density (with large bubbles and of a low specific gravity) that is effective for a heat conduction, and a second opaque layer 56 with a high-density (with small bubbles, of a high specific gravity and whiter) that is effective for a heat radiation, are laminated. An annual first opaque layer 55a is applied on the lower surface of the flange portion 4 by means of a heat melting treatment, and an annual second opaque layer 55b is applied on a lower surface of the first opaque layer 55a by means of a heat melting treatment. The thicknesses of the first opaque layer 55a and the second opaque layer 55b are to be from 4 mm to 10 mm, respectively. In order that the opaque layer 55 is not exposed outside, it is preferable that the opaque layer 55 is covered with a transparent quartz layer 56. The thickness of the transparent quartz layer 56 is to be from 1 mm to 2 mm. Thanks to this transparent quartz layer 56, it is possible to prevent that the opaque layer 55 is eroded in a HF cleaning process at a room temperature to be described layer. The first opaque layer 55a and the second opaque layer 55b can be placed upside down with respect to each other. Alternatively, the opaque layer 55 can be composed of only the first opaque layer, or of only the second opaque layer.

Figure 8:
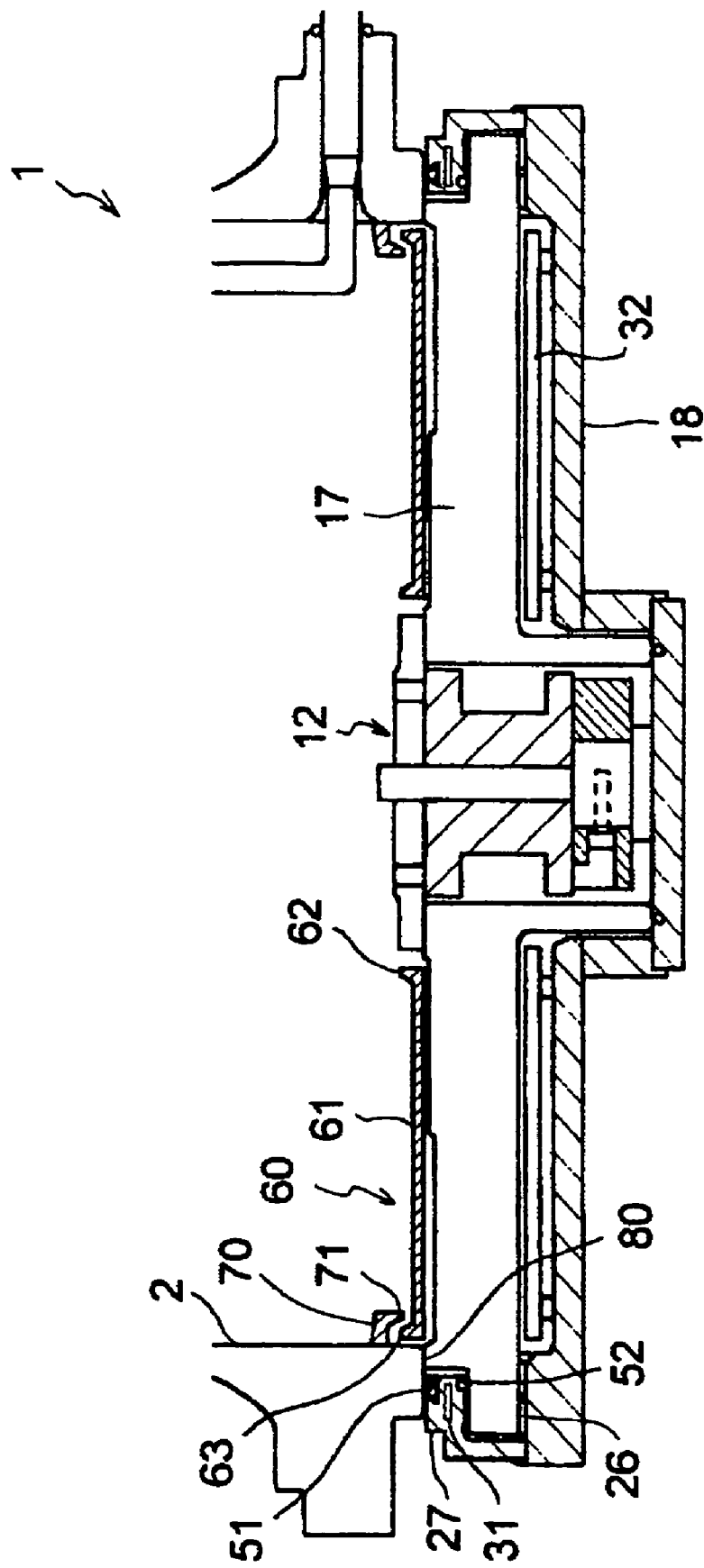
FIG. 8 is a magnified cross-sectional view of a main part of a longitudinal type of thermal processing apparatus according to the fourth embodiment of the present invention.

FIG. 8 is a magnified cross-sectional view of a main part of a longitudinal type of thermal processing apparatus of the fourth embodiment of the present invention. In the present embodiment, the same numerical signs are marked on the same parts as those in the third embodiment, and therefore, explanation thereof is omitted.

When a dry cleaning process after a film-forming process of a silicon nitride (SiN) is repeated about five times, surface roughness of an inside wall of a processing container is worse, and thus a SiN process gas is absorbed by the roughened surface, so that a depo-rate onto a wafer is lowered. To solve this problem, a dry cleaning method has been suggested wherein an inside wall of a processing container including a roughened surface part is removed by means of a HF cleaning process at a room temperature using a hydrogen fluoride (HF)(at 400 Torr and at a temperature of not more than 60° C.). However, an acid aqueous solution (a hydrofluoric acid) is generated in this HF cleaning process at a room temperature. When this aqueous solution enters into a contact surface between an inner lid part and a processing container, there is possibility that surface roughening is caused on the contact surface and that corrosion of a flange holder and an outer lid part made of a metal is caused.

Therefore, in order to solve this problem, a liquid-receiving part 60 that receives the aqueous solution generated in the HF cleaning process at a room temperature using a hydrogen fluoride (HF) is provided on an upper surface of the inner lid part, and an eave-shaped liquid-guiding part 70 is provided at a lower portion of the inner surface of the processing container so as to guide the aqueous solution, which is generated on the inner surface of the processing container 2 and flows thereon, into the liquid-receiving part 60. The liquid-guiding part 70, which is made of the quartz similarly to the processing container 2, is formed in an annual manner along the inner surface (in a circumference direction) of the processing container 2 and also in an eave-shaped manner, that is, in a manner inclined downward to a central direction. Accordingly, it is prevented that the aqueous solution flows toward a contact surface 80 between the inner lid 17 and the processing container 2. A base end portion (an outer edge portion) of the liquid-guiding part 70 is fixed on the inner surface of the processing container 2 in an integrated manner. It is preferable that a hanging part 71 that hangs downward facing to the liquid-receiving part 60 is formed at a tip portion (an inner edge portion) of the liquid-guiding part 70 that is inclined inward, in order that the aqueous solution drips down into the liquid-receiving part 60 without splashing.

The liquid-receiving part 60 can be formed directly on an upper surface of the inner lid part 17. However, as an example shown in the drawings, it is preferable that the liquid-receiving part 60 is separately provided as a liquid-receiving pan 61 made of quartz to be placed on the upper surface of the inner lid part 17. The liquid-receiving pan 61 that is the liquid-receiving part 60 is formed in an annual manner so as to cover an upper surface of the inner lid part 17, and a rising inner edge part 62 and a rising outer edge part 63 are formed at an inner part and an outer part thereof.

According to the longitudinal type of thermal processing apparatus 1 of the present embodiment, the same effect as is obtained in the third embodiment can be obtained. Furthermore, the liquid-receiving part 60 capable of receiving the aqueous solution is provided on the upper surface of the inner part 17, and the liquid-guiding part 70 for guiding the aqueous solution, which is generated on the inner surface of the processing container 2 and flows thereon, into the liquid-receiving part 60 is provided at a lower portion of the inner surface of the processing container 2, so that it can be prevented that the aqueous solution enters the contact surface 80 between the inner lid part 17 and the processing container 2. Therefore, surface roughening on the contact surface 80, corrosion of the flange holder 27 and the outer lid part 18, and the like, can be prevented.

Figure 9:
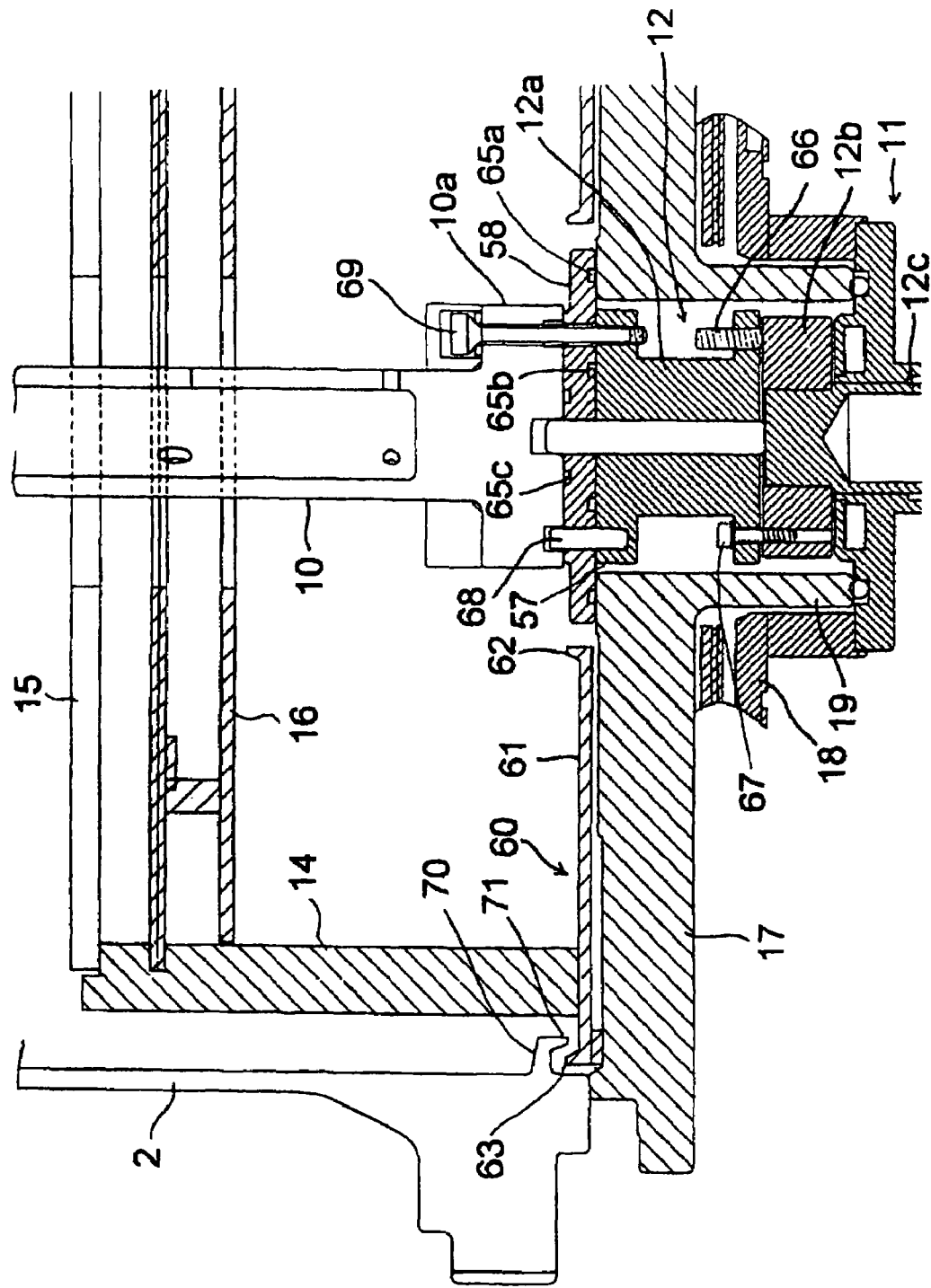
FIG. 9 is a magnified cross-sectional view of a main part of a modification example of the longitudinal type of thermal processing apparatus in FIG. 8.
Figure 10:
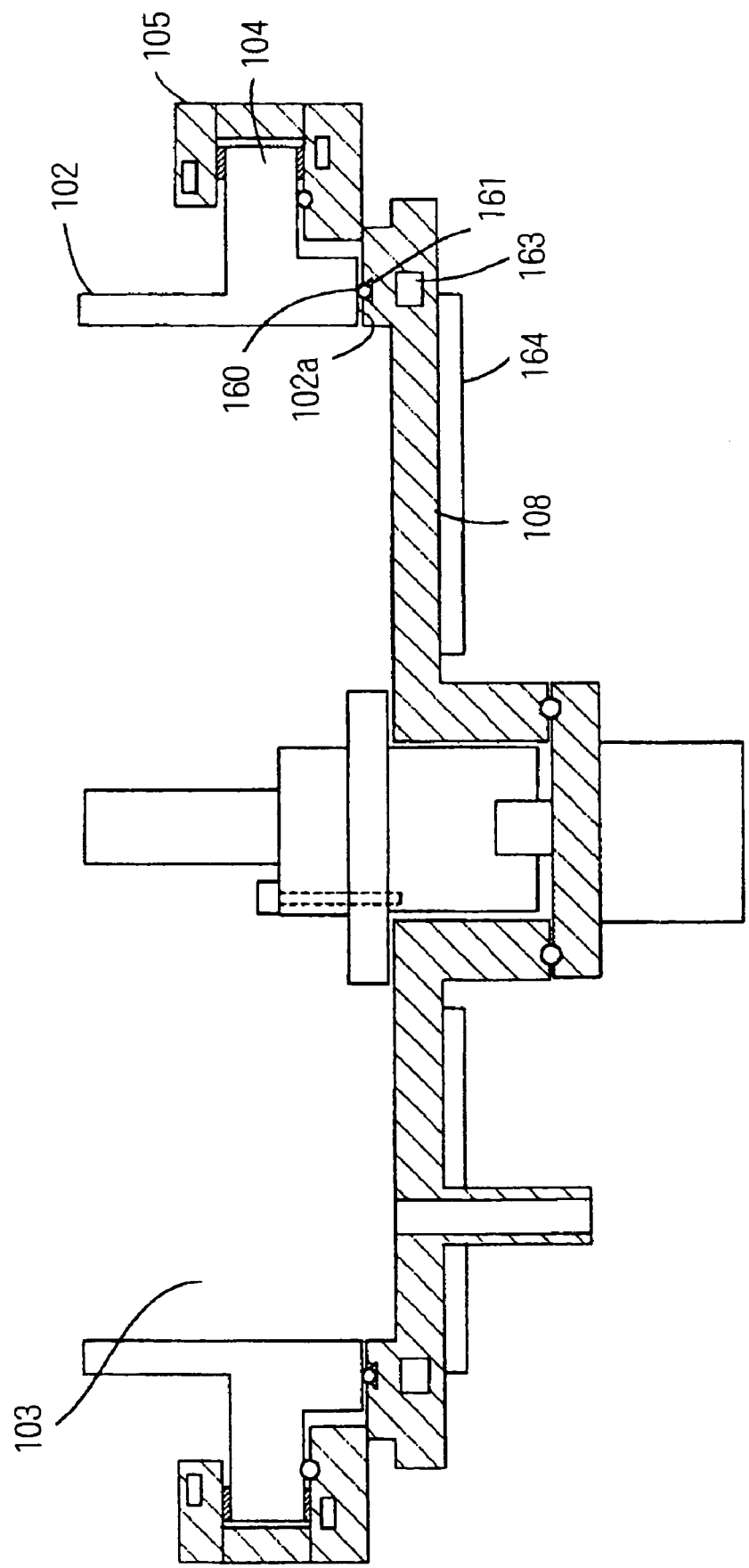
FIG. 10 is a magnified cross-sectional view of a main part of a conventional longitudinal type of thermal processing apparatus.

FIG. 9 is a magnified cross-sectional view of a main part showing a modification example of the longitudinal type of thermal processing apparatus in FIG. 8. In this example, a table plate 58 made of quartz that covers an opening end of a shaft hole 57 of an inner lid part 17 is provided on an upper end part of a rotation shaft 12 of a rotation-introducing mechanism 11. In order to prevent that an aqueous solution generated in a HF cleaning process at a room temperature invades the inside of the shaft hole 57 from a minute gap, which is formed between a lower surface of the table plate 58 and an upper surface of the inner lid part 17, to corrode parts and the like of the rotation-introducing mechanism 11, an annual groove portion 65a that extends in a circumference direction is provided on at least one of the lower surface of the table plate 58 and the upper surface of the inner lid part 17 (a lower surface of the table plate in the example shown).

The rotation shaft 12 has an upper hub 12a and a lower hub 12b made of, for example, an Inconel. The lower hub 12b is closely fitted and fixed around a rotation shaft core 12c of the rotation-introducing mechanism 11. The upper hub 12a is mounted on the lower hub 12b via a plurality of (for example, three, respectively) height-adjusting screws 66 and tightening screws 67 so as to be capable of adjusting its height.

A lower flange portion 10a of a prop 10 of a boat 9 is placed on an upper part of the upper hub 12a via the disc-shaped table plate 58. This lower flange portion 10a is positioned and fixed on the upper part of the upper hub 12a via positioning pins 68 and tightening screws 69. A minute gap (about 0.25 mm) is provided between a lower surface of the table plate 58 and an upper surface of the inner lid part 17 so that the table plate 58 can rotate out of contact with the inner lid part 17. The groove portion 65a is provided in order that a space is formed somewhere along the minute gap in order to stop a capillary phenomenon. Accordingly, it is prevented that the aqueous solution invades beyond the minute gap due to a capillary phenomenon.

In addition, it is preferable that, on at least one of a lower surface of the table plate 58 and an upper surface of the upper hub 12a (a lower surface of the table plate in the example shown), an annual groove portion 65b for preventing that the aqueous solution invades through a gap between the two surfaces is provided. Furthermore, it is preferable that, on at least one of an upper surface of the table plate 58 and a lower surface of the lower flange portion 10a of the prop 10 of the boat 9 (an upper surface of the table plate in the example shown), an annual groove portion 65c for preventing that the aqueous solution invades through a gap between the two surfaces is provided.

The groove portions 65a, 65b and 65c are to be about 1 mm in depth and about 2 mm in width, respectively. Incidentally, an inert gas, for example, a nitrogen gas, is supplied into the shaft hole 57 in order to prevent that a process gas or a cleaning gas invades the inside of the shaft hole 57.

Although the embodiments of the present invention have been explained in details based on the drawings, the present invention is not limited to the aforementioned embodiments, and various modifications of the design and the like can be made within the scope not exceeding the present invention.

The invention claimed is:

1. A longitudinal type of thermal processing apparatus comprising:
    a processing container made of quartz, having an opening part at a lower end thereof,
    a lid provided under the opening part, capable of moving up and down so as to open and close the opening part,
    a holder provided on the lid, capable of hold a plurality of objects to be processed in a tier-like manner, and
    a heating unit provided around the processing container, wherein
    the lid has an inner lid part made of quartz that comes in contact with a lower-end surface of the opening part, and an outer lid part made of a metal that covers an outside surface of the inner lid part,
    the lower-end surface of the opening part and an upper-end surface of the inner lid part, which come in contact with each other, are mirror-finished,
    a first flange is provided at an outside periphery of the opening part,
    the first flange is located higher than the lower-end surface of the opening part,
    a second flange is provided at an outside periphery of the inner lid part,
    the second flange is located lower than the upper-end surface of the inner lid part,
    a flange holder is provided between the first flange and the second flange, and
    a channel for vacuuming is formed by: an inner surface of the flange holder, a lower surface of the first flange, an upper surface of the second flange, an outer surface of the inner lid part from the second flange to the upper-end surface, and an outer surface of the opening part from the lower-end surface to the first flange.

2. A longitudinal type of thermal processing apparatus according to claim 1, wherein
    the flange holder is made of a metal, and is provided on the first flange via a sheet made of a resin,
    a first O-ring that seals between the first flange and the flange holder and a second O-ring that seals between the second flange and the flange holder are provided on the flange holder, and
    the channel for vacuuming is formed by: the first O-ring, an inner surface of the flange holder from the first O-ring to the second O-ring, the second O-ring, an upper surface of the second flange inside the second O-ring, an outer surface of the inner lid part from the second O-ring to the upper-end surface, an outer surface of the opening part from the lower-end surface to the first flange, and a lower surface of the first flange inside the first O-ring.

3. A longitudinal type of thermal processing apparatus according to claim 2, wherein
    a central opening part is formed at a central portion of the outer lid part,
    a third flange of a rotation-introducing mechanism, which causes the holder to rotate, is fixed on a lower surface of the central opening part so as to close the central opening part,
    a rotation shaft of the rotation-introducing mechanism extends upward from a central portion of the third flange,
    a boss part that surrounds the rotation shaft is formed at a central portion of the inner lid part,
    double third and fourth O-rings are provided between a lower-end surface of the boss part and an upper surface of the third flange, which come in contact with each other, and
    a gas-discharging hole for vacuuming a space defined by the lower-end surface of the boss part, the upper surface of the third flange and the third and fourth O-rings is formed in the first flange.

4. A longitudinal type of thermal processing apparatus according to claim 3, wherein
    the gas-discharging hole is connected to the channel for vacuuming.

5. A longitudinal type of thermal processing apparatus according to claim 2, wherein
    a plurality of patches made of a resin is screwed on the flange holder so as to come in contact with an outer-periphery surface of the first flange to form a predetermined gap between the flange holder and the first flange.

* * * * *